United States Patent
Hsu et al.

(10) Patent No.: US 7,928,534 B2
(45) Date of Patent: Apr. 19, 2011

(54) BOND PAD CONNECTION TO REDISTRIBUTION LINES HAVING TAPERED PROFILES

(75) Inventors: Kuo-Ching Hsu, Chung-Ho (TW);
Chen-Shien Chen, Zhubei (TW);
Hon-Lin Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 287 days.

(21) Appl. No.: 12/347,742

(22) Filed: Dec. 31, 2008

(65) Prior Publication Data
US 2010/0090319 A1 Apr. 15, 2010

Related U.S. Application Data

(60) Provisional application No. 61/104,186, filed on Oct. 9, 2008.

(51) Int. Cl.
*H01L 29/41* (2006.01)
(52) U.S. Cl. ........................................................ 257/621
(58) Field of Classification Search .................. 257/621
See application file for complete search history.

(56) References Cited

U.S. PATENT DOCUMENTS

| 6,897,125 | B2 | 5/2005 | Morrow et al. |
| 2008/0079121 | A1 | 4/2008 | Han |
| 2010/0013102 | A1 | 1/2010 | Tay et al. |
| 2010/0022034 | A1 | 1/2010 | Antol et al. |
| 2010/0090318 | A1 | 4/2010 | Hsu et al. |
| 2010/0276787 | A1 | 11/2010 | Yu et al. |

OTHER PUBLICATIONS

Shen, L.-C., et al., "A Clamped Through Silicon Via (TSV) Interconnection for Stacked Chip Bonding Using Metal Cap on Pad and Metal Column Forming in Via," Electronic Components and Technology Conference, 2008, pp. 544-549.

*Primary Examiner* — Evan Pert
(74) *Attorney, Agent, or Firm* — Slater & Matsil, L.L.P.

(57) ABSTRACT

An integrated circuit structure includes a semiconductor substrate having a front side and a backside. A through-silicon via (TSV) penetrates the semiconductor substrate, wherein the TSV has a back end extending to the backside of the semiconductor substrate. A redistribution line (RDL) is formed over the backside of the semiconductor substrate and connected to the back end of the TSV. A passivation layer is over the RDL with an opening formed in the passivation layer, wherein a portion of a top surface of the RDL and a sidewall of the RDL are exposed through the opening. A metal finish is formed in the opening and contacting the portion of the top surface and the sidewall of the RDL.

20 Claims, 6 Drawing Sheets

BOND PAD CONNECTION TO REDISTRIBUTION LINES HAVING TAPERED PROFILES

This application claims the benefit of the following provisionally filed U.S. patent application: Application Ser. No. 61/104,186, filed Oct. 9, 2008, and entitled "Bond Pads Contacting Sidewalls of RDL for Reliable TSV Connection," which application is hereby incorporated herein by reference.

TECHNICAL FIELD

This invention relates generally to integrated circuit structures, and more particularly to through-silicon vias, and even more preferably to the formation of bond pads connected to the through-silicon vias.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and lengths of interconnections between devices as the number of devices increases. When the number and the lengths of interconnections increase, both circuit RC delay and power consumption increase.

Among the efforts for resolving the above-discussed limitations, three-dimensional integrated circuits (3DICs) and stacked dies are commonly used. Through-silicon vias (TSVs) are thus used in 3DIC and stacked dies for connecting dies. In this case, TSVs are often used to connect the integrated circuits on a die to the backside of the die. In addition, TSVs are also used to provide short grounding paths for grounding the integrated circuits through the backside of the die, which may be covered by a grounded metallic film.

FIG. 1 illustrates a conventional TSV 102 formed in chip 104. TSV 102 is in silicon substrate 106. Through the interconnections (metal lines and vias, not shown) in the metallization layers, TSV 102 is electrically connected to bond pad 108, which is on the front surface of chip 104. TSV 102 is exposed through the back surface of substrate 106 in the form of a copper post. When chip 104 is bonded to another chip, TSV 102 is bonded to a bond pad on the other chip, with or without solder therebetween. This scheme suffers from drawbacks. Since the TSV bonding requires relatively large pitch between TSVs, the location of the TSVs are restricted and the distance between the TSVs needs to be big enough to allow room for, for example, solder balls. New backside structures are thus needed.

SUMMARY OF THE INVENTION

In accordance with one aspect of the present invention, an integrated circuit structure includes a semiconductor substrate having a front side and a backside. A through-silicon via (TSV) penetrates the semiconductor substrate, wherein the TSV has a back end extending to the backside of the semiconductor substrate. A redistribution line (RDL) is formed over the backside of the semiconductor substrate and connected to the back end of the TSV. A passivation layer is over the RDL with an opening formed in the passivation layer, wherein a portion of a top surface of the RDL and a sidewall of the RDL are exposed through the opening. A metal finish is formed in the opening and contacting the portion of the top surface and the sidewall of the RDL.

In accordance with another aspect of the present invention, an integrated circuit structure includes a semiconductor substrate including a front side and a backside. A TSV penetrates the semiconductor substrate, wherein the TSV has a back end extending beyond the backside of the semiconductor substrate. An RDL is over the backside of the semiconductor substrate and connected to the back end of the TSV. The RDL includes an RDL strip contacting the TSV; and an RDL pad having a greater width than the RDL strip. The integrated circuit structure further includes a passivation layer over the RDL; an opening in the passivation layer, wherein substantially all sidewalls of the RDL pad are exposed through the opening; and a metal finish layer in the opening and contacting the sidewall of the RDL pad. The metal finish layer contacts substantially all sidewalls of the RDL pad. A top surface of the metal finish layer is higher than a top surface of the passivation layer.

In accordance with yet another aspect of the present invention, an integrated circuit structure includes a semiconductor substrate having a front side and a backside; and a TSV penetrating the semiconductor substrate. The TSV has a back end extending beyond the backside of the semiconductor substrate. An RDL is over the backside of the semiconductor substrate and connected to the back end of the TSV. The RDL has a tapered profile with a top portion of the RDL being narrower than a respective bottom portion of the RDL. The integrated circuit structure further includes a passivation layer over the RDL; and an opening in the passivation layer. A portion of the RDL is exposed through the opening. A metal finish is formed in the opening and contacting the portion of the RDL. The metal finish layer may include a nickel layer, a palladium layer, and/or a gold layer.

The advantageous features of the present invention include improved adhesion between metal finishes and RDLs. In addition, it is easier to clean the residues, resulting in a more reliable bonding structure.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel backside connection structure connecting to through-silicon vias (TSVs) and the method of forming the same are provided. The intermediate stages of manufacturing a preferred embodiment of the present invention are illustrated. The variations of the preferred embodiments are discussed. Throughout the various views and illustrative embodiments of the present invention like reference numbers are used to designate like elements.

Figure 1:
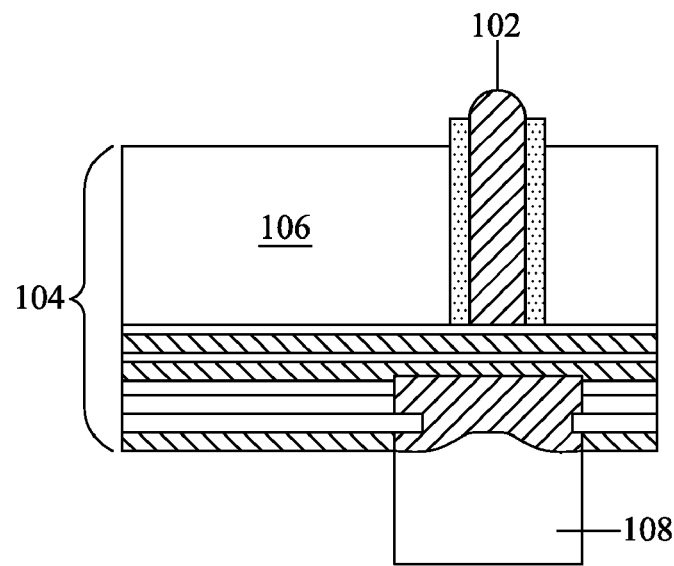
FIG. 1 illustrates a conventional integrated circuit structure including a through-silicon via (TSV), wherein the TSV protrudes through the backside of a substrate, and is bonded to a bond pad on another chip in the form of a copper post.
Figure 2:
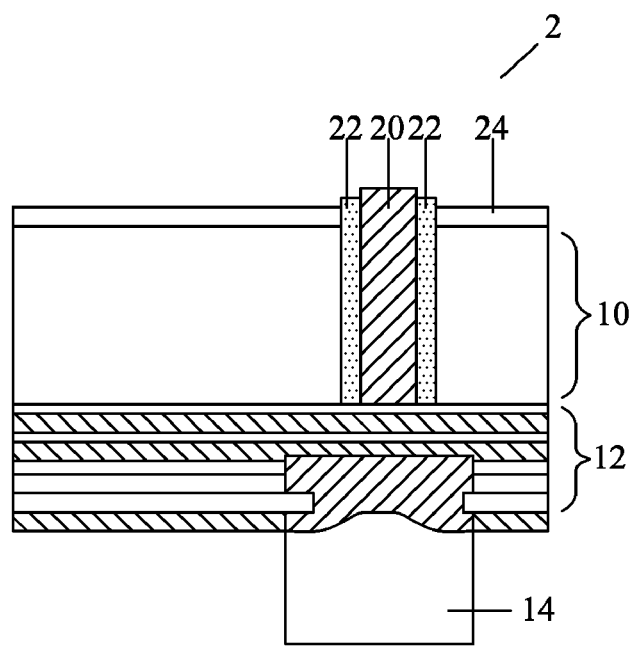
FIGS. 2 through 8 are top views and cross-sectional views of intermediate stages in the manufacturing of an embodiment of the present invention.

Referring to FIG. 2, chip 2, which includes substrate 10 and integrated circuits (not shown) therein, is provided. Substrate 10 is preferably a semiconductor substrate, such as a bulk silicon substrate, although it may include other semiconductor materials such as group III, group IV, and/or group V elements. Semiconductor devices, such as transistors (not shown), may be formed at the front surface (the surface facing down in FIG. 2) of substrate 10. Interconnect structure 12, which includes metal lines and vias (not shown) formed therein, is formed under substrate 10 and connected to the semiconductor devices. The metal lines and vias may be formed of copper or copper alloys, and may be formed using the well-known damascene processes. Interconnect structure 12 may include commonly known inter-layer dielectric (ILD) and inter-metal dielectrics (IMDs). Bond pad 14 is formed on the front side (the side facing down in FIG. 2) of, and protrudes beyond, the front surface of chip 2.

TSV 20 is formed in substrate 10, and extends from the back surface (the surface facing up in FIG. 2) to the front surface (the surface with active circuits formed thereon). In a first embodiment, as shown in FIG. 2, TSV 20 is formed using a via-first approach, and is formed before the formation of interconnect structure 12. Accordingly, TSV 20 only extends to the ILD that is used to cover the active devices, but not into the IMD layers in interconnect structure 12. In alternative embodiments, TSV 20 is formed using a via-last approach, and is formed after the formation of interconnect structure 12. Accordingly, TSV 20 penetrates through both substrate 10 and interconnect structure 12. Isolation layer 22 is formed on the sidewalls of TSV 20 and electrically insulates TSV 20 from substrate 10. Isolation layer 22 may be formed of commonly used dielectric materials such as silicon nitride, silicon oxide (for example, tetra-ethyl-ortho-silicate (TEOS) oxide), and the like.

TSV 20 is exposed through, and protrudes out of, the back surface of substrate 10. Preferably, backside isolation layer 24 is formed covering the backside of substrate 10. In an exemplary embodiment, the formation of backside isolation layer 24 includes etching the back surface of substrate 10, blanket forming backside isolation layer 24, and lightly performing a chemical mechanical polish to remove the portion of backside isolation layer 24 directly over TSV 20. Accordingly, TSV 20 is exposed through an opening in backside isolation layer 24. In alternative embodiments, the opening in backside isolation layer 24, through which TSV 20 is exposed, is formed by etching.

Figure 3:
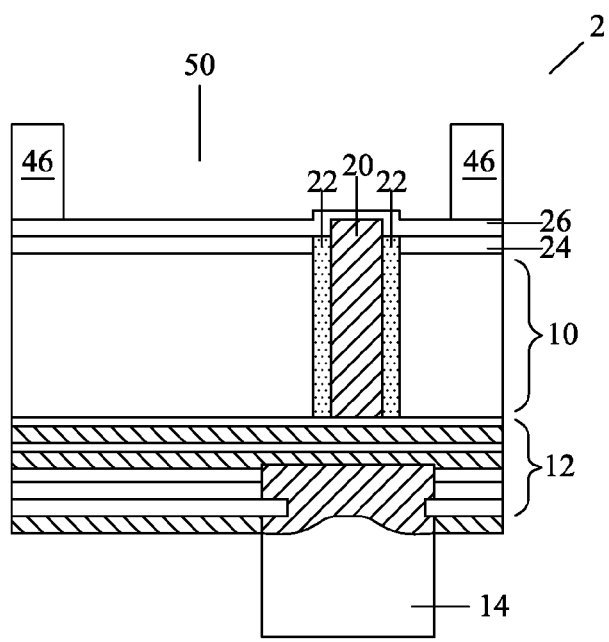

Referring to FIG. 3, thin seed layer 26, also referred to as an under-bump metallurgy (UBM), is blanket formed on backside isolation layer 24 and TSV 20. The usable materials of UBM 26 include copper or copper alloys. However, other metals, such as silver, gold, aluminum, and combinations thereof, may also be included. In an embodiment, UBM 26 is formed using sputtering. In other embodiments, physical vapor deposition (PVD) or electro plating may be used.

FIG. 3 also illustrates the formation of mask 46. Mask 46 may be formed of a photoresist, which may be a dry film or a liquid photo resist. Mask 46 is then patterned to form opening 50 in mask 46, with TSV 20 being exposed through opening 50.

Figure 4:
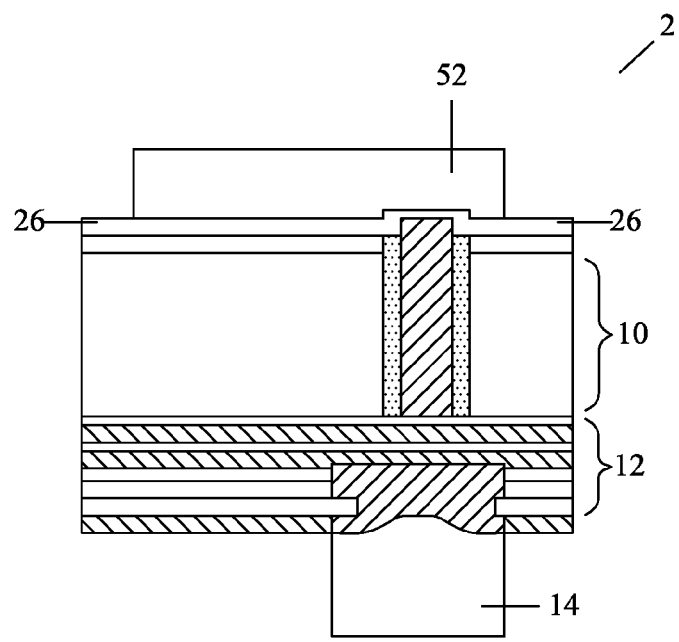

In FIG. 4, opening 50 is selectively filled with a metallic material, forming redistribution line (RDL) 52 in opening 50. Since TSV 20 protrudes out of the back surface of substrate 10, TSV 20 extends into RDL 52. This advantageously increases the strength of the joint between TSV 20 and RDL 52. In an embodiment, the filling material includes copper or copper alloys, although other metals, such as aluminum, silver, gold, and combinations thereof, may also be used. The formation methods preferably include electrochemical plating (ECP), electroless plating, or other commonly used deposition methods such as sputtering, printing, and chemical vapor deposition (CVD) methods. Mask 46 is then removed. As a result, the portions of UBM 26 underlying mask 46 are exposed.

Figure 5:
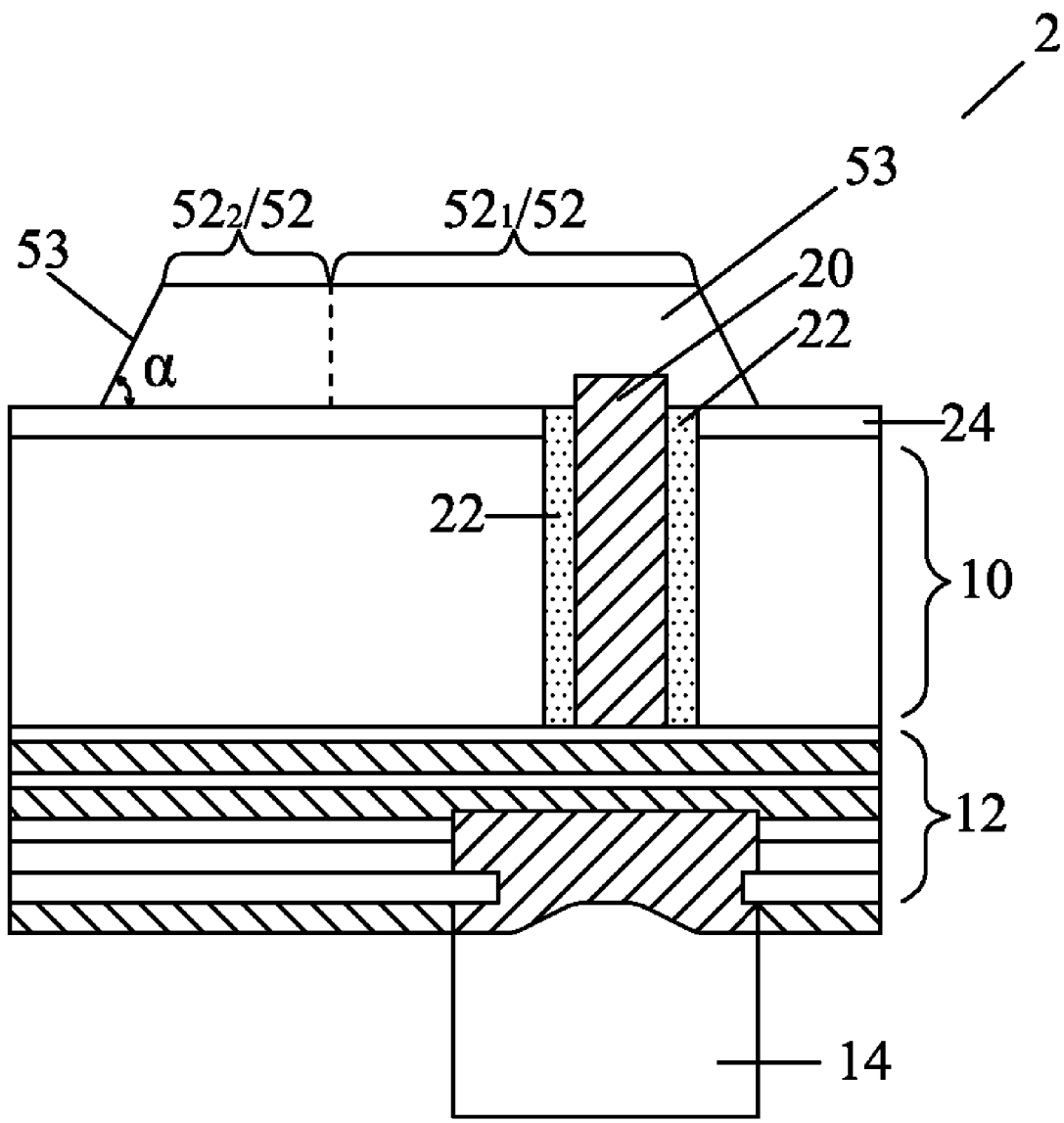
Figure 7A:
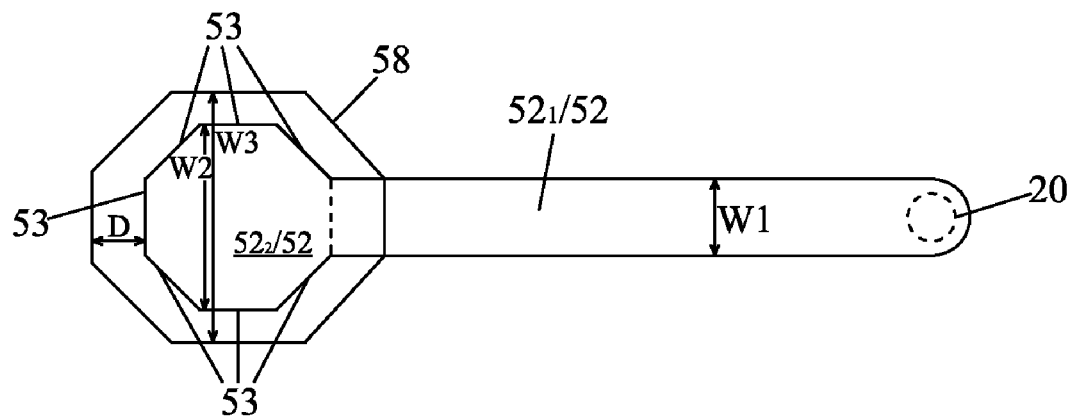
Figure 7B:
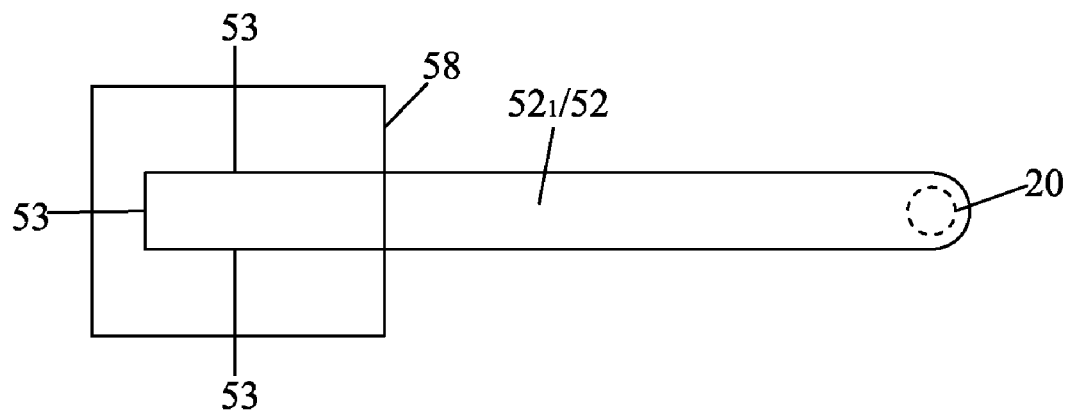

Referring to FIG. 5, the exposed portions of UBM 26 are removed by a flash etching. The remaining RDL 52 may include RDL strip (also referred to as redistribution trace) $52_1$ that includes a portion directly over, and connected to, TSV 20, and optionally RDL pad $52_2$ joining RDL strip $52_1$. The possible top views of RDL 52 are shown in FIGS. 7A and 7B. In FIG. 5 and subsequent figures, UBM 26 is not shown since it is typically formed of similar materials as RDL 52, and thus it appears to be merged with RDL 52. In the preferred embodiment, RDL 52 has a tapered profile, with the top width and top length greater than the respective bottom width and bottom length. In other words, sidewalls 53 of RDL 52 are slanted, with the inner angles $\alpha$ being less than 90 degrees, and more preferably less than about 80 degrees, and even more preferably less than about 70 degrees. Such a tapered profile may be formed by performing an over-etching in the flash etching that is used to remove the exposed portions of UBM 26, for example, by extending the etching time to two times or three times the time needed for removing exposed UBM 26. Advantageously, with RDL 52 having the tapered profile, it is easy to fully remove the undesirable portions of passivation layer 56 during the patterning of passivation layer 56.

Figure 6A:
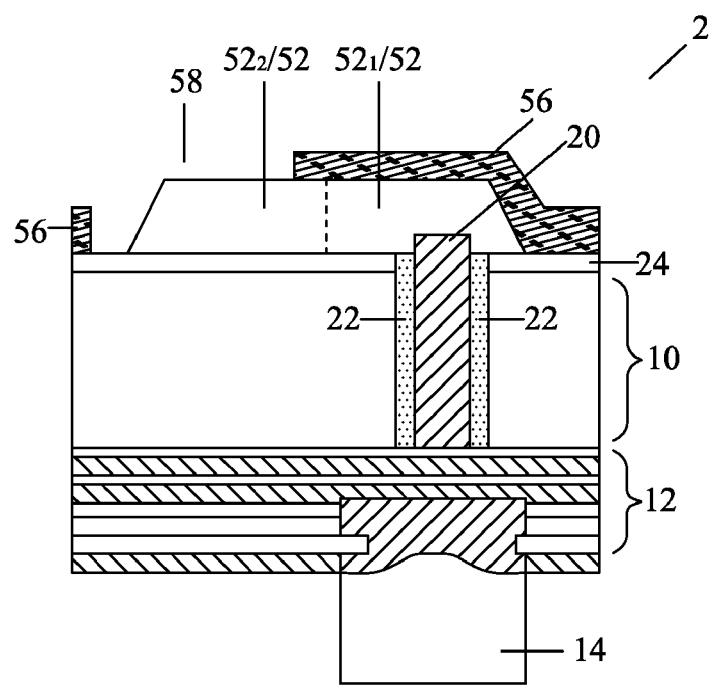
Figure 6B:
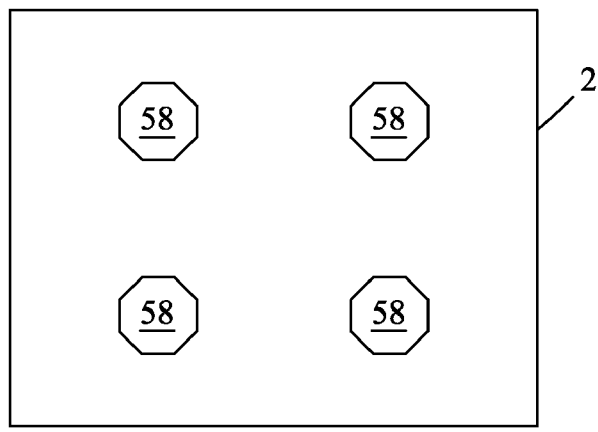

Next as shown in FIG. 6A, passivation layer 56 is blanket formed and patterned to form opening 58. Passivation layer 56 may be formed of nitrides, oxides, polyimide, and the like. A portion of RDL pad $52_2$ is exposed through opening 58 in passivation layer 56. Preferably, besides a center portion of RDL pad $52_2$, sidewalls of RDL pad $52_2$ are also exposed through opening 58. RDL strip $52_1$ remains to be covered by passivation layer 56. It is realized that one chip may include a plurality of TSVs 20, as shown in FIG. 6B, which is a top view of chip 2. In the preferred embodiment, the sizes of openings 58 throughout chip 2 are substantially uniform. The uniform size of openings 58 results in the same amount of solder needed for bonding each of the plurality of TSVs, so that the likelihood of having cold joint or non-joint is reduced.

FIG. 7A illustrates a top view of opening 58 and RDL 52. Preferably, at least one sidewall 53 of RDL 52 is exposed through opening 58. Accordingly, the remaining portion of passivation layer 56 is preferably spaced apart from sidewall 53. Opening 58 may have a greater area than RDL pad $52_2$, and hence an entirety (or substantially an entirety, for example, greater than about 90 percent of the area of) of RDL pad $52_2$ is exposed through opening 58. Accordingly, other sidewalls 53 of RDL pad $52_2$ are also exposed. Alternatively, only a portion of RDL pad $52_2$ is exposed. In an exemplary embodiment, RDL strip $52_1$ has width W1 between about 5

μm and about 15 μm. RDL pad 52₂ has width W2 of about 60 μm to about 80 μm, while opening 58 has width W3 of about 100 μm. Please note that the dimensions of the illustrated features are not in scale. In alternative embodiments, as shown in FIG. 7B, RDL 52 does not have RDL pad 52₂ that is wider than RDL strip 52₁. Accordingly, opening 58 only exposes RDL strip 52₁, which preferably includes an end of RDL strip 52₁.

Figure 8:
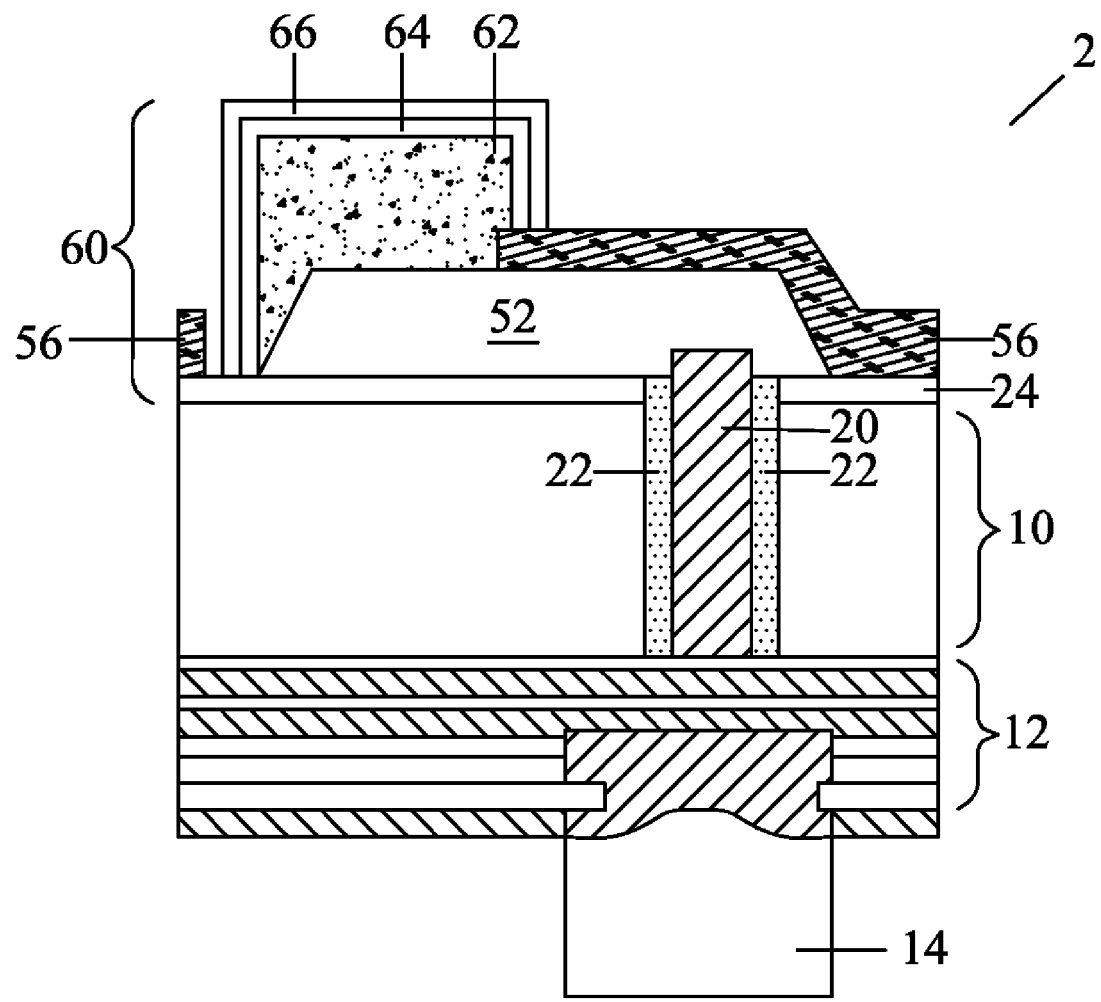

Next, as shown in FIG. 8, metal finish 60 is formed in opening 58. The formation methods of metal finish 60 include ECP, electroless plating, and the like. In the preferred embodiment, metal finish 60 includes nickel layer 62 directly on, and contacting, RDL pad 52₂. Optionally, addition layers, such as gold layer 66, or gold layer 66 on palladium layer 64, may be formed on nickel layer 62. The thickness of nickel layer 62 is greater than the thickness of passivation layer 56, so that the top surface of nickel layer 62 is higher than the top surface of passivation layer 56. The formation of palladium layer 64 and gold layer 66 further increase the height of metal finish 60, so that the standoff between chip 2 (and the respective wafer in which chip 2 is located), is adequate for the flow of the underfill that will be filled in subsequent packaging steps. With the formation of the metal finish as above-discussed, there is no need to form a copper pad in opening 58, or a eutectic bond pad in opening 58, wherein the eutectic bond pad typically includes an eutectic solder material formed of Sn—Pb alloy, for example.

The embodiments of the present invention have several advantageous features. By forming RDLs with tapered profiles, it is easy to clean residues such as leftovers of passivation layers, particularly at regions close to the sidewalls of the RDLs. With the metal finishes contacting the sidewalls of RDL strips and/or RDL pads, the adhesion between the metal finishes and the respective underlying RDLs is improved, resulting in a more reliable packaging structure.

Although the present invention and its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, and composition of matter, means, methods, and steps described in the specification. As one of ordinary skill in the art will readily appreciate from the disclosure of the present invention, processes, machines, manufacture, compositions of matter, means, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
   a semiconductor substrate comprising a front side and a backside;
   a through-silicon via (TSV) penetrating the semiconductor substrate, the TSV comprising a back end extending to the backside of the semiconductor substrate;
   a redistribution line (RDL) over the backside of the semiconductor substrate and connected to the back end of the TSV;
   a passivation layer over the RDL and having an opening, wherein a portion of a top surface of the RDL and a sidewall of the RDL are exposed through the opening; and;
   a metal finish contacting the exposed portions of the top surface and the sidewall of the RDL.

2. The integrated circuit structure of claim 1, wherein the RDL has a tapered profile with a top portion of the RDL being narrower than a respective bottom portion of the RDL.

3. The integrated circuit structure of claim 1, wherein the backend of the TSV extends into the RDL.

4. The integrated circuit structure of claim 1, wherein the RDL comprises:
   an RDL strip connected to the TSV;
   an RDL pad having a width greater than a width of the RDL strip, wherein the sidewall of the RDL exposed through the opening comprises a sidewall of the RDL pad.

5. The integrated circuit structure of claim 4, wherein substantially all sidewalls of the RDL pad are exposed through the opening, and wherein the metal finish contacts substantially all sidewalls of the RDL pad.

6. The integrated circuit structure of claim 1, wherein substantially an entirety of the RDL has a substantially uniform width, wherein the RDL comprises a first end and a second end on opposite sides of the TSV, and wherein the sidewall of the RDL exposed through the opening belongs to the first end.

7. The integrated circuit structure of claim 1, wherein the metal finish comprises a nickel layer.

8. The integrated circuit structure of claim 7, wherein the metal finish further comprises a gold layer over the nickel layer.

9. The integrated circuit structure of claim 8, wherein the metal finish further comprises a palladium layer between and adjoining the nickel layer and the gold layer.

10. The integrated circuit structure of claim 1, wherein an edge of the passivation layer facing the sidewall of the RDL is spaced apart from a respective edge of the metal finish.

11. An integrated circuit structure comprising:
    a semiconductor substrate comprising a front side and a backside;
    a through-silicon via (TSV) penetrating the semiconductor substrate, the TSV comprising a back end extending beyond the backside of the semiconductor substrate;
    a redistribution line (RDL) over the backside of the semiconductor substrate and connected to the back end of the TSV, the RDL comprising:
    an RDL strip contacting the TSV; and
    an RDL pad having a greater width than the RDL strip, wherein the RDL pad joins the RDL strip;
    a passivation layer over the RDL;
    an opening in the passivation layer, wherein substantially all sidewalls of the RDL pad are exposed through the opening; and
    a nickel layer in the opening and contacting the sidewall of the RDL pad, wherein the nickel layer contacts substantially all sidewalls of the RDL pad, and wherein a top surface of the nickel layer is higher than a top surface of the passivation layer.

12. The integrated circuit structure of claim 11, wherein the RDL has a tapered profile with a top portion of the RDL being narrower than a respective bottom portion of the RDL.

13. The integrated circuit structure of claim 11 further comprising a gold layer over the nickel layer.

14. The integrated circuit structure of claim 13 further comprising a palladium layer between and adjoining the nickel layer and the gold layer.

15. An integrated circuit structure comprising:
- a semiconductor substrate comprising a front side and a backside;
- a through-silicon via (TSV) penetrating the semiconductor substrate, the TSV comprising a back end extending beyond the backside of the semiconductor substrate;
- a redistribution line (RDL) over the backside of the semiconductor substrate and connected to the back end of the TSV, wherein the RDL has a tapered profile with a top portion of the RDL being narrower than a respective bottom portion of the RDL;
- a passivation layer over the RDL;
- an opening in the passivation layer, wherein a portion of the RDL is exposed through the opening; and
- a metal finish in the opening and contacting the portion of the RDL.

16. The integrated circuit structure of claim 15, wherein substantially an entirety of a sidewall of the RDL contacts the metal finish.

17. The integrated circuit structure of claim 15, wherein the RDL comprises:
- an RDL strip connected to the TSV;
- an RDL pad having a width greater than a width of the RDL strip, wherein the sidewall of the RDL contacting the metal finish is a sidewall of the RDL pad.

18. The integrated circuit structure of claim 17, wherein substantially all sidewalls of the RDL pad are exposed through the opening and contacting the metal finish.

19. The integrated circuit structure of claim 15, wherein substantially an entirety of the RDL has a substantially uniform width, wherein the RDL comprises a first end and a second end on opposite sides of the TSV, and wherein a sidewall of the first end contacts the metal finish.

20. The integrated circuit structure of claim 15, wherein the metal finish comprises:
- a nickel layer in the opening and contacting the RDL; and
- a gold layer over the nickel layer.

* * * * *